(12) United States Patent
Melbourne

(10) Patent No.: US 11,519,951 B2
(45) Date of Patent: Dec. 6, 2022

(54) BURIED CABLE BREAK DETECTOR AND METHOD

(71) Applicant: David J. Melbourne, Arlington, TX (US)

(72) Inventor: David J. Melbourne, Arlington, TX (US)

(73) Assignee: Robin Autopilot Holdings, LLC, Irving, TX (US)

( * ) Notice: Subject to any disclaimer, the term of this patent is extended or adjusted under 35 U.S.C. 154(b) by 122 days.

(21) Appl. No.: 17/102,572

(22) Filed: Nov. 24, 2020

(65) Prior Publication Data

US 2022/0074983 A1    Mar. 10, 2022

Related U.S. Application Data

(60) Provisional application No. 63/075,922, filed on Sep. 9, 2020.

(51) Int. Cl.
| | |
|---|---|
| *G01R 31/08* | (2020.01) |
| *G01R 23/02* | (2006.01) |
| *G01R 27/02* | (2006.01) |
| *G01R 31/12* | (2020.01) |
| *G01R 31/11* | (2006.01) |
| G01R 31/58 | (2020.01) |
| G01R 31/52 | (2020.01) |

(52) U.S. Cl.
CPC .......... *G01R 31/083* (2013.01); *G01R 23/02* (2013.01); *G01R 27/02* (2013.01); *G01R 31/08* (2013.01); *G01R 31/11* (2013.01); *G01R 31/1272* (2013.01); *G01R 31/52* (2020.01); *G01R 31/58* (2020.01)

(58) Field of Classification Search
CPC ...... G01R 31/083; G01R 23/02; G01R 27/02; G01R 23/04; G01R 31/08; G01R 31/1272; G01R 31/11; G01R 31/58; G01R 31/52
USPC ......................... 324/500, 512, 520
See application file for complete search history.

(56) References Cited

U.S. PATENT DOCUMENTS

| | | | | |
|---|---|---|---|---|
| 2007/0257657 A1* | 11/2007 | Stevens | ................ | G01R 15/202 324/72.5 |
| 2013/0271328 A1* | 10/2013 | Nickel | .................. | G01R 29/10 343/703 |
| 2022/0021159 A1* | 1/2022 | Hoshiba | ............. | H01R 13/6597 |

* cited by examiner

*Primary Examiner* — Raul J Rios Russo
(74) *Attorney, Agent, or Firm* — Dan Brown Law Office; Daniel R. Brown

(57) ABSTRACT

A buried perimeter loop wire break detector with a base unit and probe unit. The base unit injects different frequencies into the two ends of the loop wire and the probe unit detects the frequencies at a test location along the wire. If a signal is not detected, that indicates the direction toward the break. By halving the distance along the wire toward the break and retesting, the location is quickly determined. Both frequencies and amplitude are measured, sometimes with amplification, both earth and wired grounds may be employed, and a micro-ohmmeter measures resistance of the loop wire to indicate satisfactory operation.

21 Claims, 9 Drawing Sheets

System Operation

Amplifiers and Filter

BURIED CABLE BREAK DETECTOR AND METHOD

BACKGROUND OF THE INVENTION

Related Applications

None.

Field of the Invention

The present disclosure generally relates to locating and repairing breaks in buried cables or wires. More particularly, the present disclosure relates to locating breaks in buried perimeter loop wires used for electronic perimeter control systems.

Description of Related Art

Robotic lawn mowers, invisible dog fences, and other similar perimeter control systems often employ a buried loop of wire that forms an electronic perimeter, which serves to constrain and limit movement of equipment or animals therein. Such loop wires are routed about a perimeter and are then buried in the ground, typically a few inches deep. The loop wire is then connected to a host system, which sends signals through the loop wire. The terminal units operating in such electronic perimeter control systems are responsive to the signals on the loop wire, to thereby constrain movement of the terminal units within the defined perimeter. Such loop wires are subject to damage over time, which may be due to harsh handling during installation, exposure to the elements, landscaping operations, pet activities, exposure to vermin, corrosion, robotic mower operations, and the like. Such damage may result in complete or partial breaks in the loop wire.

Those skilled in the art are aware that complete breaks and partial breaks are a near-constant source of ongoing maintenance requirements. Prior art loop wire break detectors use radio frequency signals injected into the loop wire in conjunction with a handheld receiver coil and detector that is held above the ground, which output tones that are used to locate the loop wire and any breaks therein. In practice, moisture in the ground, external interference or poor connections can cause the RF signals to couple or pass over the troubled location, resulting in failure to detect breaks in the loop wire. Many times the only option is to rewire the entire perimeter loop wire, with associated costs. The presence of both original and replacement loop wires also results in later wire identification confusion, resulting in further diagnostic problems. More sophisticated loop wire break detections techniques are known, however teaching the use of complicated test equipment to measure the loop resistance to field technicians has proven difficult. Thus is can be appreciated that there is a need in the art from an improved system and method for locating complete and partial breaks in buried perimeter loop wires.

SUMMARY OF THE INVENTION

The need in the art is addressed by the teachings of the present disclosure. The present disclosure teaches a system for locating breaks in a buried loop wire, which includes a base unit that has a signal generator coupled to first and second terminals for connection to ends of the loop wire, and where the signal generator is enabled to sequentially couple first and second frequency signal to the first and second terminals. A a probe unit has a signal detector responsive to the first and second frequency signals, which is coupled to a probe terminal, and also has first and second direction indicators, which correspond to directions along the loop wire to the first and second terminals. The base unit and probe unit each have a ground terminal. An electrical ground means is connected between the ground terminals. A test probe is connected to the probe terminal and to a test location along the loop wire. In operation, the probe unit, upon detecting one of the signals activates one of the indicators to indicate there is a break in the loop wire in the direction of the corresponding first or second terminal on the non-detected frequency.

In a specific embodiment of the foregoing system, the electrical ground means includes a first earth ground rod connected to the first ground terminal, and a second earth ground rod connected to the second ground terminal, which thereby establishes an earth ground path between the base unit and the probe unit. In a refinement to this embodiment, when the signal detector detects both frequencies, which correspondingly activates both of the first and second direction indictors, the system further includes replacement of the first and second earth ground rods with a wire ground conductor connected between the first and second ground terminals. In a further refinement to this embodiment, the probe unit further includes an amplifier and a mode selector switch selectable between a STAKED mode and a WIRED mode.

In a specific embodiment of the foregoing system, during operation, while the earth ground path is connected, actuation of the mode selector switch to the STAKED mode connects the probe terminal directly to the signal detector, and while the wire ground conductor is connected, actuation of the mode selector switch to the WIRED mode connects the probe terminal through the amplifier and to the signal detector. In a refinement to this embodiment, while the WIRED mode is selected, the signal detector compares amplitudes of the first and second frequencies, and is responsive to activate either of the first or second direction indicators that corresponds with the lower amplitude signal.

In a specific embodiment of the foregoing system, the base unit further includes an indicator and a micro-ohmmeter coupled to measure a resistance value between the first and second terminals, and the base unit compare the measured resistance value with a resistance threshold value, such that the base unit indicates that there is no break in the loop wire if the resistance value is less than the resistance threshold value, and indicates that there is a break in the loop wire if the resistance value is greater than the threshold resistance value. In a refinement to this embodiment, the indicator is a display that displays the measured resistance value.

In a specific embodiment of the foregoing system, the first and second frequency signal are square wave signals at different frequencies within the audible frequency range.

In a specific embodiment of the foregoing system, the signals detector distinguishes the first frequency signal from the second frequency signal by measuring the frequencies thereof.

In a specific embodiment of the foregoing system, the signal generator repetitively and sequentially couples the first test frequency for a first time period followed by the second test frequency for a second time period.

The present disclosure teaches a method of locating breaks in a loop wire that is buried in the soil, using a base unit with a signal generator, and a probe unit with a signal detector. The method includes connecting the base unit to the ends of the loop wire, and connecting an electrical ground between the base unit and the probe unit to establish a ground reference between them. The method also includes sequentially coupling a first frequency signal into the first end of the loop wire, and a second frequency signal into the second end for the loop wire. Also, connecting a test probe between the probe unit and a first location along the loop wire, and detecting either of the first test signal or the second test signal by the signal detector. Upon detecting the first frequency signal, indicating there is a break in the loop wire in the direction of the second end, and upon detecting the second frequency signal, indicating there is a break in the loop wire in the direction of the first end. The method continues by relocating the test probe to a second location along the loop wire in the indicated direction of the break in the loop wire and repeating the detecting step.

In a specific embodiment of the foregoing method, the connecting an electrical ground step further includes connecting a first earth ground rod to the base unit, and a second earth ground rod to the probe unit, thereby establishing an earth ground path as the ground reference. In a refinement to this embodiment, the method includes, upon detecting both of the first frequency and the second frequency at the detecting step; replacing the earth ground path with a wire ground conductor, and repeating the detecting step.

In a specific embodiment of the foregoing method, where the probe unit includes and amplifier and a mode selector for either a STAKED mode or a WIRED mode, the method further includes, while the earth ground path is connected, the detecting step is initiated using the mode selector to engage a STAKED mode, which connects the test probe to the signal detector, and while the wire ground conductor is connected, the detecting step is initiated using the mode selector to engage a WIRED mode, which amplifies the test probe connection to the signal detector. In a refinement to this embodiment, the detecting step in the WIRED mode is accomplished by comparing the amplitude of the first frequency signal with the amplitude of the second frequency signal, where the lower amplitude signal is indicative of the direction of the break in the loop wire.

In a specific embodiment of the foregoing method, where the base unit includes a micro-ohmmeter, the method further includes measuring a resistance value between the first and second end of the loop wire, and comparing that with a resistance threshold value. And, upon determining that the measured resistance value is less than the resistance threshold value, indicating that there is no break in the loop wire, and terminating the detection step, or, upon determining that the resistance value is greater than the threshold value, indicating that there is a break in the loop wire, and continuing the determining step. In a refinement to this embodiment, the method includes displaying the resistance value by the base unit.

In a specific embodiment, the foregoing method further includes, upon measuring a resistance value this is greater then the resistance threshold value, setting a BREAK variable, and upon measuring a subsequent resistance value that is less then the resistance threshold value while set BREAK variable is set, indicating that the loop wire break has been eliminated.

In a specific embodiment of the foregoing method, the first frequency signal and second frequency signal are square wave signals at different frequencies within the audible frequency range.

In a specific embodiment of the foregoing method, the detecting step is accomplished by identifying the frequency of either the first test frequency or the second test frequency.

In a specific embodiment of the foregoing method, the sequentially coupling step includes repetitively coupling the first test frequency for a first time period followed by coupling the second test frequency for a second time period, wherein the time periods are the same duration.

DESCRIPTION OF THE INVENTION

Figure 1:
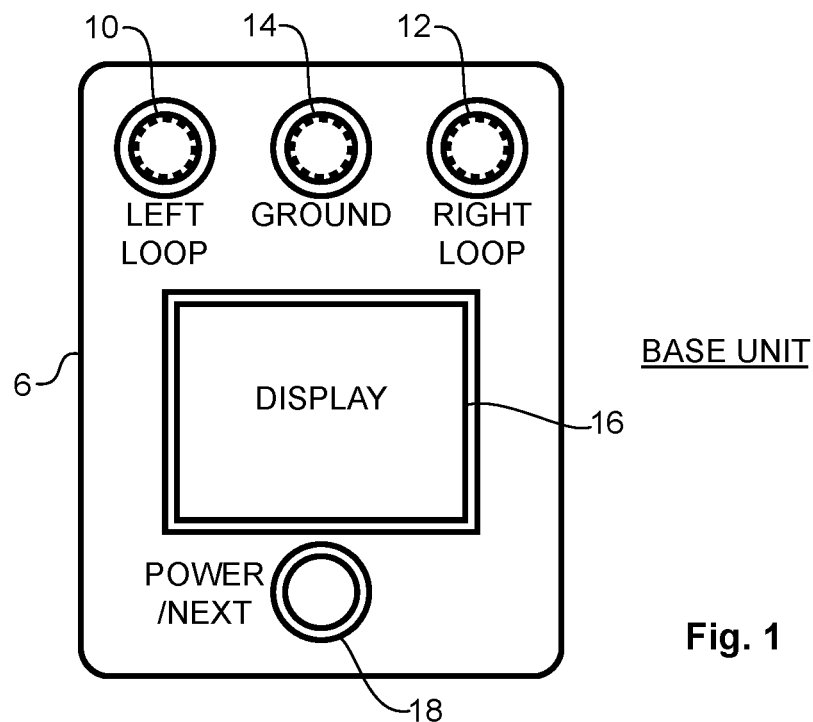
FIG. 1 is a front view drawing of a cable break detector base unit according to an illustrative embodiment of the present invention.

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope hereof, and additional fields in which the present invention would be of significant utility.

In considering the detailed embodiments of the present invention, it will be observed that the present invention resides primarily in combinations of steps to accomplish various methods or components to form various apparatus and systems. Accordingly, the apparatus and system components, and method steps, have been represented where appropriate by conventional symbols in the drawings, showing only those specific details that are pertinent to understanding the present invention so as not to obscure the disclosure with details that will be readily apparent to those of ordinary skill in the art having the benefit of the disclosures contained herein.

In this disclosure, relational terms such as first and second, top and bottom, upper and lower, and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises a" does not, without more constraints, preclude the existence of additional identical elements in the process, method, article, or apparatus that comprises the element.

The present disclosure teaches a wire or cable break finder system that locates both partial breaks and complete breaks in buried perimeter loop wires, which are used to carry guidance signals in perimeter control systems. Examples include robotic lawn mowers, dog fences, and other perimeter systems, which employ a buried loop of wire that forms an electronic perimeter to serve as a constraining system for such equipment or pets, and etc. The present disclosure teaches a system that consists of a battery powered base unit and a battery powered detector probe unit. An illustrative embodiment of the present disclosure differs from other commercial buried cable break finders in that, when a "WIRED" mode is chosen, the perimeter loop wires are resistively loaded by the detecting probe unit to reveal the direction to poor connections, and which avoids signal confusion caused by conductance through the soil itself. A partial break meaning that there is some reduced conductivity across a physical break in an electric conductor, which may result from soil conditions and moisture levels.

The systems of the present disclosure employ the use of relatively low frequency break detecting signals, which are generated by the base unit. Since the low frequency signals generated by the base unit are less capable of coupling across breaks in the loop wire and poor connections, regardless of moisture, loop wire breaks can be found more reliably. By sending alternate, differing, frequencies down opposing ends of the loop wire, the probe unit can distinguish, and inform, which direction the break is from any point probed along the length of the loop wire. The base unit features a display that continuously measures, and displays, the loop wire resistance which, when used in conjunction with selectively dividing the length of sections, and probing the loop wire, results in the rapid locating of breaks and poor connections.

An illustrative embodiment of the present teachings features two distinct operational modes, referred to as the "STAKED" mode and the "WIRED' mode. The STAKED mode is useful for locating completely open circuits in dry ground where the loop wire resistance displayed is infinite or very large. By grounding the base unit to the soil using a ground rod, and by grounding the probe unit to the soil using another ground rod, both of which are "staked" into the soil, convenient operation and rapid break location is achieved. On the other hand, WIRED mode is useful for partial breaks in the loop wire, such as those in wet conditions or where a connection is poor. WIRED mode involves connecting a long ground wire from the base unit to the probe unit at its test location. When the WIRED mode is selected on the probe unit, an additional resistive load is applied to assist in isolating the direction along the loop wire toward the partial break, thereby rejecting false positives caused by signal wire ground conductance and poor soil connections.

The type of wire used to build perimeter loop wires for robotic mowers and dog fences are rated at a given number of milli-ohms per foot. Knowing the total resistance of the perimeter loop wire around a property is helpful to technicians repairing a broken perimeter loop wire, because higher resistance values are indicative of a wire break condition. The base unit of an illustrative embodiment is equipped with a built-in micro-ohmmeter that repeatedly measures the end to end loop wire resistance. Common US yards range from approximately one ohm to fifteen ohms total. Thus, it an be appreciated that be defining a threshold resistance value, perhaps approximately thirty ohms, virtually all loop wire lengths can be measured, and determined to be break-free if the total resistance is below that threshold.

During operation in the STAKED mode, a portable probe unit is carried to approximately halfway around the perimeter loop wire and a ground rod is staked into the soil and connected to a GROUND terminal on the probe unit. A test probe is connected to a PROBE terminal in the probe unit, and the test probe tip is attached to the loop wire at that location. A STAKED mode switch is actuated, which causes the probe unit to test for the first and second test signals injected into the loop wire by the base unit. The probe unit illuminates either of a LEFT LED or a RIGHT LED, indicating the direction of the good connection to the base unit, and conversely indicating the direction to move towards the break in the loop wire. By halving the suspect perimeter loop wire again and again, the target break can be quickly located. Once the halving distance is small, typically less than twenty feet, the short length of the perimeter wire is pulled up and replaced.

During operation in the WIRED mode, such as for wet conditions where test signals could be coupled accrues a loop wire break or a poor connection, a physical ground wire is connected between the base unit and the probe unit such that their respective chassis grounds are coupled at near-zero resistance. Thusly, when the WIRED actuator is actuated, the probe unit resistively loads the detected signals so as to isolate any test signal reception caused by coupling across the break or other poor connection. Again, the probe unit detects the stronger test signal, and illuminates either the RIGHT LED or the LEFT LED to indicate direction of the good and broken conductor path.

Reference is directed to FIG. 1, which is a front view drawing of a cable break detector base unit 6 according to an illustrative embodiment of the present invention. The base unit 6 provides a hand-holdable enclosure with internal electronic circuitry (not shown) and certain user interface components, as follows. A POWER/NEXT actuator 18 presents a momentary contact switch that is used both for turning the power to the unit 6 on and off, and to step through menu selections, as will be more fully discussed hereinafter. Opposing ends of a buried perimeter loop wire (not shown) are connected to the LEFT LOOP terminal 10 and the RIGHT LOOP terminal 12 during test operations. A GROUND terminal 14 is presented, which is used to connect either an earth ground rod (also referred to as a ground stake) or a ground coupling wire (neither shown), which may be connected to a similar ground terminal on a cable break detector probe unit (see FIG. 2). An alpha-numeric display 16 is also provided on the base unit 6 for presentation of instructions and operational parameters, which are further detailed elsewhere in this disclosure.

Figure 2:
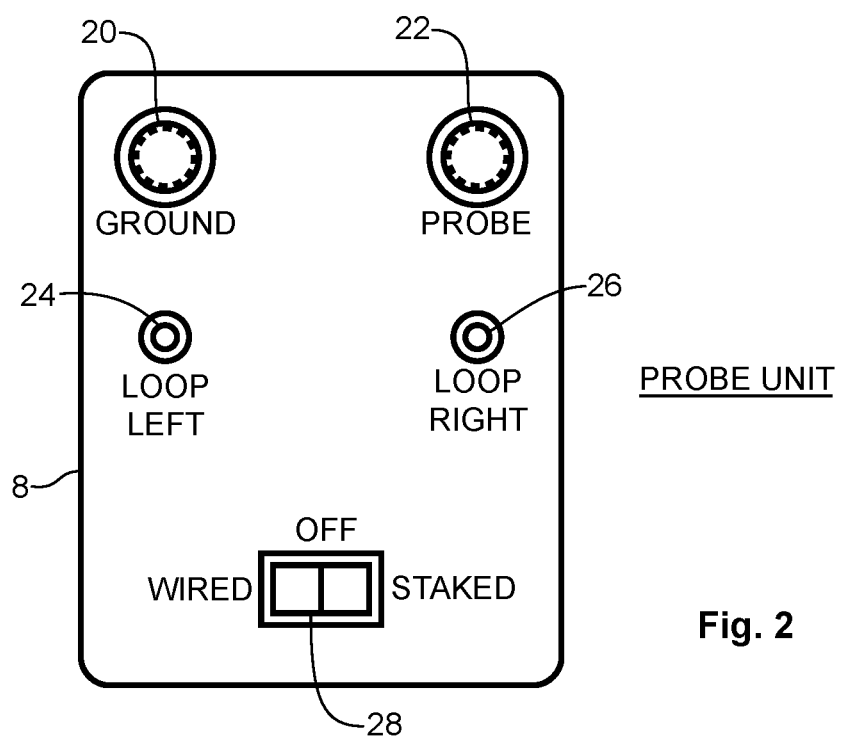
FIG. 2 is a front view drawing of a cable break detector probe unit according to an illustrative embodiment of the present invention.

Reference is directed to FIG. 2, which is a front view drawing of a cable break detector probe unit 8 according to an illustrative embodiment of the present invention. The probe unit 8 provides a hand-holdable enclosure with internal electronic circuitry (not shown) and certain user interface components, as follows. A GROUND terminal 20 is presented, which is used to connect either an earth ground rod (also referred to as a ground stake) or a ground coupling wire (neither shown), which may be connected to the GROUND terminal 14 of the base unit 6 (see FIG. 1). Both of a LEFT LOOP illuminator 24 and a RIGHT LOOP illuminator 26 are presented for providing visual directional guidance to the user. In the illustrative embodiments, light emitting diodes (LED) are employed as illuminators. A rocker switch 28 is presented, which rests at a center OFF position, and may be rocked to either of a WIRED position or a STAKED position, as illustrated, to power the probe unit 8 in one of two modes of operation. This nomenclature corresponds to the type of ground connection that is employed during operation. WIRED mode is appropriate where a ground conductor (not shown) is connected to the GROUND terminal 20, and STAKED mode is appropriate where a ground rod that has been staked into soil (not shown) is connected to the GROUND terminal 20.

Figure 3:
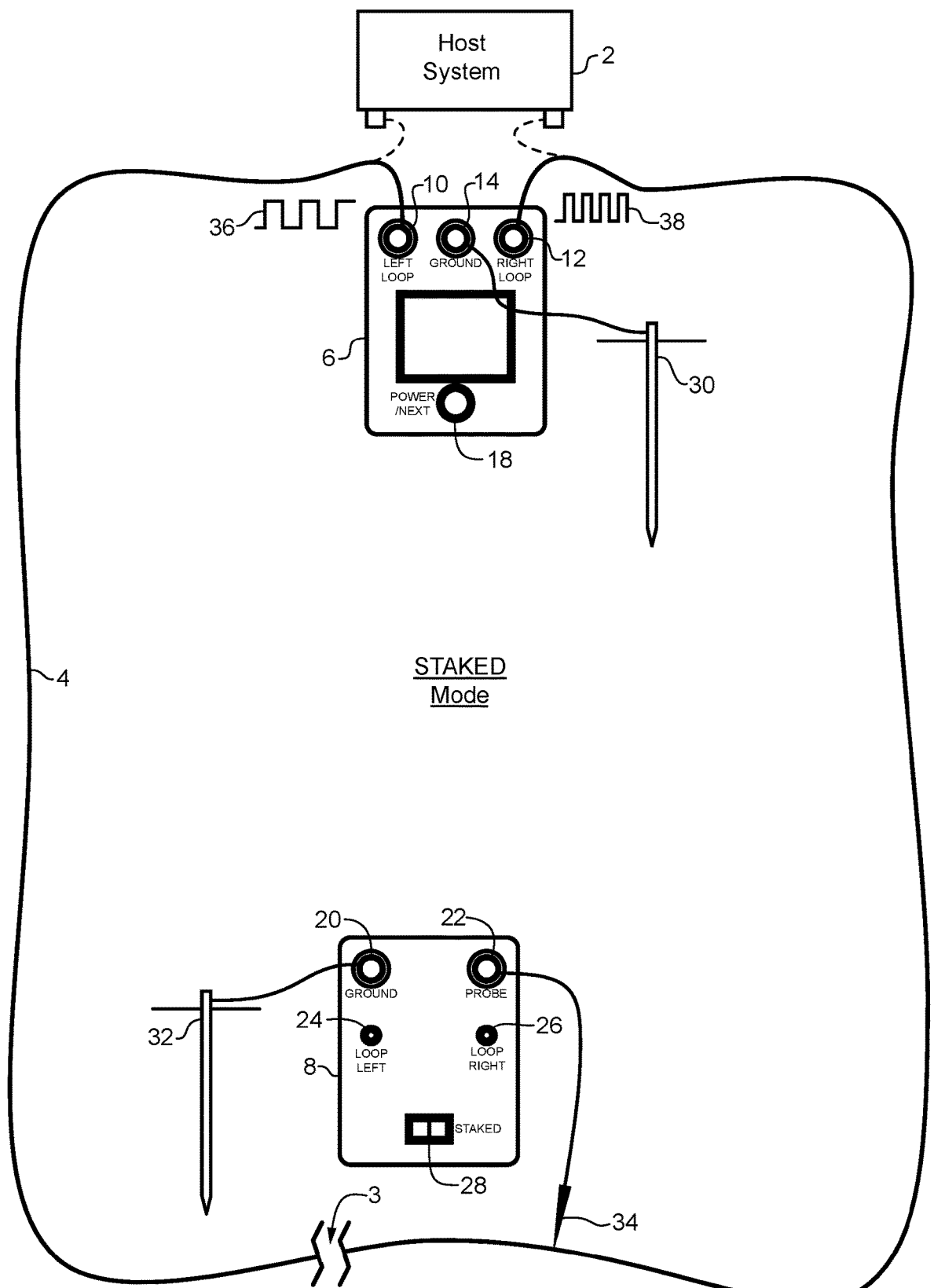
FIG. 3 is a diagram of a cable break detector operating in the STAKED mode according to an illustrative embodiment of the present invention.

Reference is directed to FIG. 3, which is a diagram of a cable break detector system operating in the STAKED mode according to an illustrative embodiment of the present invention. The system consists of a base unit 6 and a probe unit 8, and certain accessories as will be described herein. A buried perimeter loop wire 4 is normally coupled to a host system 2, but is disconnect therefrom during the test procedures discussed herein. Note that the loop wire 4 has a complete break 3 in this illustrative embodiment. Such a break 3 may present infinite resistance, or a resistance so great that it is de facto infinite in value. The opposing ends of the loop wire 4 are connected to the base unit 6 LEFT LOOP terminal 10 and RIGHT LOOP terminal 12, as illustrated. Note that the directional references will be used to assist the user in determining which direction the break 3 is located, and which direction to move about the loop wire 4 as the test procedure is carried out. The base unit 6 GROUND terminal 14 is connected to a ground rod 30 that is staked into the soil adjacent the base unit 6. Note that during test operations, the base unit 6 injects two electric signals 36, 38 into the two ends of the loop wire 4, respectively, through the LEFT LOOP terminal 10 and RIGHT LOOP terminal 12. In the illustrative embodiment, these are square wave signals operating between zero volts and five volts at 125 Hz and 250 Hz, respectively. The frequencies are selected to be low enough to have no FCC conducted or radiated emissions limitation requirements, and also do not traverse moisture well. The 125 Hz and 250 Hz frequencies may be adjusted slightly to avoid the possibility that harmonics or edge conditions that could cause false detections. Other waveforms and other frequencies may be employed effectively as well. It is noteworthy that higher frequencies may couple though damp or wet soil more easily, so frequencies under 1 kHz are generally recommend, but any audio frequency may be effective, and radio frequencies, perhaps greater then 10 kHz may present stay coupling challenges that degrade system testing performance.

FIG. 3 also illustrates a cable break detector probe unit 8. The probe unit 8 is moved along the length of the loop wire 4 as the testing procedure commences. A ground rod 32 is staked into the soil adjacent the test position, and is connected to the GROUND terminal 20 of the probe unit 8. A test probe 34 is connected to the PROBE terminal 22 of the probe unit 8. At each test position the loop wire is exposed and the tip of the probe 34 is electrically coupled to a conductor in the loop wire 4, to thereby sense and detect one of the two electrical signals 36, 38 emitted by the base unit 6. In this manner, the direction of the break 3 can be discerned by which frequencies are detected and not detected, because the break 3 prevents one of the frequencies from reaching the test probe 34, while the other frequency flows easily through the low resistance loop wire 4. The LOOP LEFT illuminator 24 and LOOP RIGHT illuminator 26 on the probe unit 8 indicate to the user from which direction the detected signal is coming, as well as in which direction to move along the loop wire so as to isolate the precise portion of the loop wire 4 having the break 3 therein. In practice, the distance along the loop wire 4 that the user moves is halved on each subsequent test, and this halving very quickly locates the break 3, as exponential calculations will quickly reveal to one skilled in the art.

Note in FIG. 3 that the use of ground rods 30, 32 facilitates quick set-up and movement about the perimeter loop 4 as the testing and distance-halving operations commence. Of course, the use of ground rods 30, 32 presumes a suitably high ground conductivity such that the voltage swings of the test frequency can be detected, relying on the input impedance of the circuits (not shown) measuring the signal are much greater than the resistivity of the ground rod conductivity path, as will be appreciated by those skilled in the art.

Figure 4:
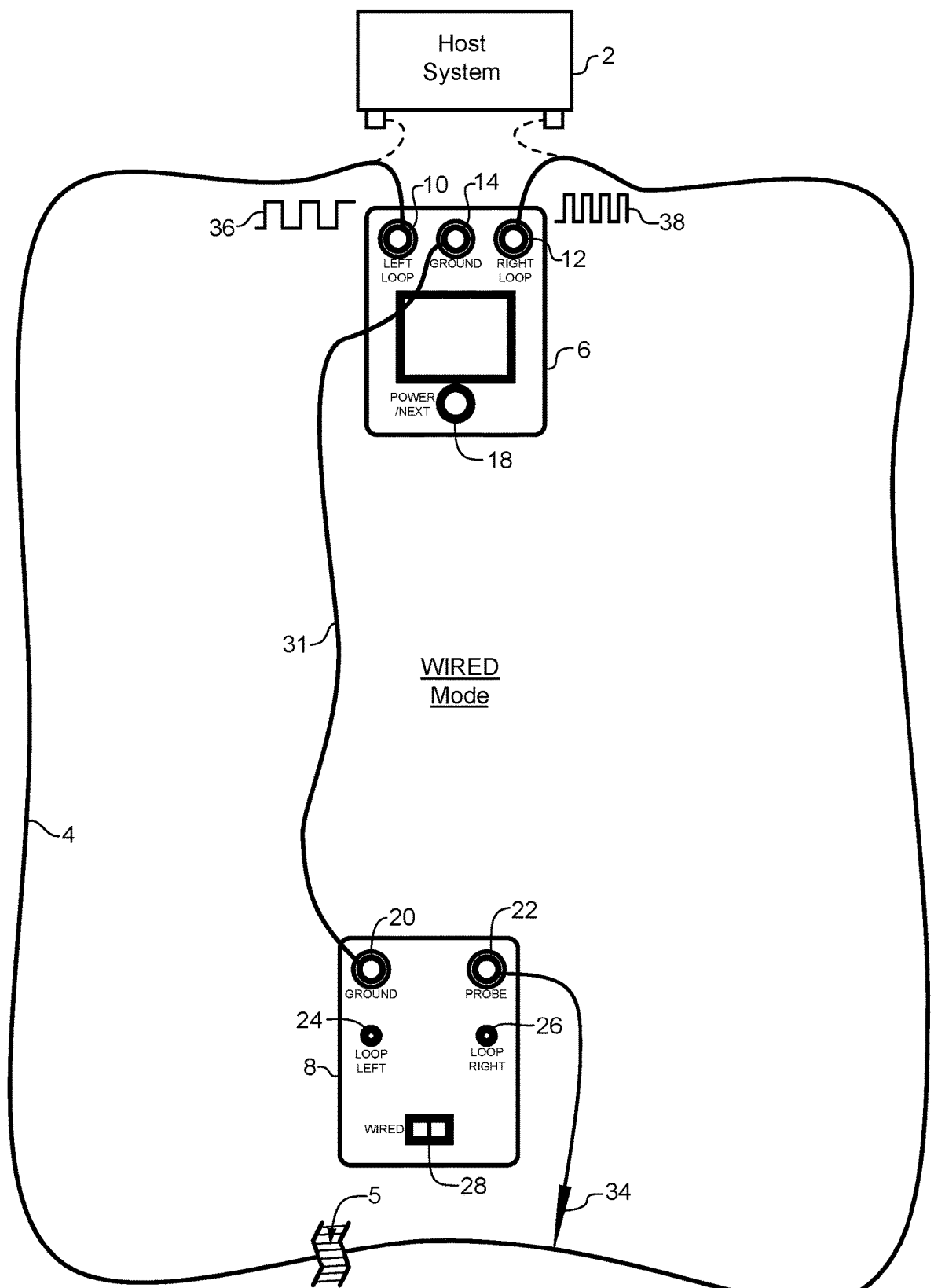
FIG. 4 is a diagram of a cable break detector operating in the WIRED mode according to an illustrative embodiment of the present invention.

Reference is directed to FIG. 4, which is a diagram of a cable break detector system operating in the WIRED mode according to an illustrative embodiment of the present invention. The system consists of a base unit 6 and a probe unit 8, and certain accessories as will be described herein. A buried perimeter loop wire 4 is normally coupled to a host system 2, but is disconnect therefrom during the test procedures discussed herein. Note that the loop wire 4 has a partial break 5 in this illustrative embodiment. A partial break 5 may present a lower resistance than the previously discussed infinite resistance of a complete break, but still substantially higher than the intrinsic resistance of the perimeter loop resistance. The intrinsic loop wire resistance is low, and depends on the length, gauge, and wire material. This will typically be less than thirty ohms. A partial break 5 may result from a damaged loop wire 4 conductor, or may present itself with some level of conductance induced by damp soil conditions, soil high in salts, and other factors. Such partial break 5 resistance may be frequency dependent, decreasing with increasing frequency, which is a reason the present system employee low frequency test signals. The opposing ends of the loop wire 4 are connected to the base unit 6 LEFT LOOP terminal 10 and RIGHT LOOP terminal 12, as illustrated. In the WIRED mode, the base unit 6 GROUND terminal 14 is connected using ground wire 31 to GROUND terminal 20 of the probe unit 8, thereby obviating the issues related to ground conductivity and resistance.

During test operations in FIG. 4, the base unit 6 injects two electric signals 36, 38 into the two ends of the loop wire 4, respectively, through the LEFT LOOP terminal 10 and RIGHT LOOP terminal 12. The base unit also measure and displays the loop resistance using a micro-ohmmeter circuit, which is more fully discussed hereinafter.

FIG. 4 also illustrates a cable break detector probe unit 8. The probe unit 8 is moved along the length of the loop wire 4 as the testing procedure commences. A test probe 34 is connected to the PROBE terminal 22 of the probe unit 8. At each test position the loop wire is exposed and the tip of the test probe 34 is electrically coupled to a conductor in the loop wire 4, to thereby sense and detect the two electrical signals 36, 38 emitted by the base unit 6. In this manner, the direction of the break 5 can be discerned by which frequency has a stronger signal, because that frequency amplitude will be larger signal in that it is less attenuated than the other frequency, which must pass through the resistance of the break 5. The LOOP LEFT illuminator 24 and LOOP RIGHT illuminator 26 on the probe unit 8 indicate to the user from which direction the stronger detected signal is coming, as well as in which direction to move along the loop wire so as to isolate the precise portion of the break 3 therein. In practice, the distance along the loop wire 4 that the user moves is halved on each subsequent test, and this halving very quickly locates the break 3. Note in FIG. 4 that the use of a ground wire 31 requires the task of running the wire and moving it as the test procedure is carried out.

Figure 5:
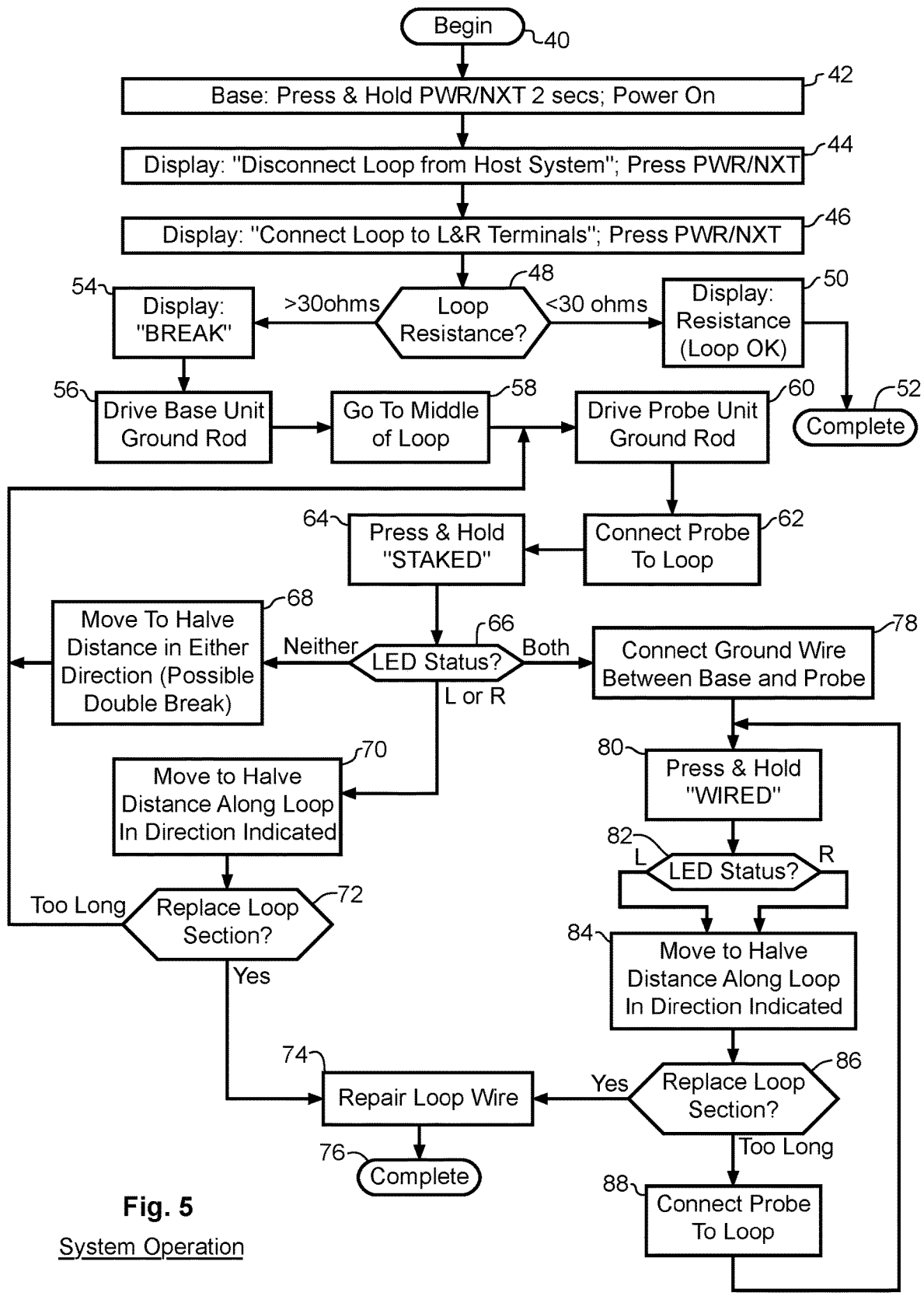
FIG. 5 is process flow diagram of system operation of a cable break detector according to an illustrative embodiment of the present invention.

Reference is directed to FIG. 5, which is process flow diagram of system operation of a cable break detector system according to an illustrative embodiment of the present invention. This process flow diagram is that of a loop wire break and repair process. The process begins at step 40 and at step 42, the user presses and holds the power/next ("PWR/NXT") actuator on the base unit for at least two seconds. This action powers the base unit, whose internal processor commences operation. At step 44, the processor in the base unit displays a message on the base unit display for the user to disconnect the buried perimeter loop wire from the host system, and then pauses to allow the user to attend to that task. After which, the user presses PWR/NXT. At step 46, the display instructs the user to connect the loop wire left and right ends to the LEFT and RIGHT terminals on the base unit, and pauses. Once complete, the user presses PWR/NXT, and the process continues to step 48.

At step 48 in FIG. 5, the base unit processor measures the loop resistance using an internal micro-ohmmeter. Note that this resistance may be low, typically less than thirty ohms indicating that there is no break in the loop wire, or it may be higher, near infinite, or infinite indicating the there is a complete break in the loop wire. But more commonly, the resistance may be greater than the thirty ohm threshold, indicating that is a break of some lesser degree than an infinite resistance break. Accordingly, at step 48 a test of the loop wire resistance is conducted, and if the resistance is less than thirty ohms, indicating there is no break in the loop wire, the base unit processor displays that resistance value, indicating to the user the the loop wire is in good condition, so the test process is complete at step 52. On the other hand, if the resistance is greater than thirty ohms at step 48, then a break in the loop wire has been detected, and the processor display "BREAK" at step 54.

Continuing in FIG. 5, at step 56, the user stakes a ground rod into the soil adjacent to the base unit and connects that to the base unit GROUND terminal. The user moves to the approximate middle of the perimeter loop wire at step 58, and at step 60, the user stakes a probe unit ground rod into the soil at that location, and connects that to the probe unit GROUND terminal, and thereby creates a ground conductive pathway between the two units, albeit of unknown earth ground resistance. At step 62, the user exposes the loop wire at the chosen test location and connects the test probe tip of the probe unit to the loop wire at that location. At step 64, the user presses and holds the STAKED switch of the probe unit and views the LEFT and RIGHT LED illuminators.

At step 66 in FIG. 5, the user views the LED illuminator status, and proceeds as follows. If neither LED is illuminated, then neither of the two test frequency signals emitted by the base unit are being detected by the probe unit, which may indicate a double break in the loop wire, where the test probe may be connected to an unconnected section of the loop wire. In this case, the user moves the test probe location, in either direction they choose, and returns to step 60 to relocate the probe unit ground rod and repeats the foregoing test steps. On the other hand, at step 66, if either one of the LEFT or RIGHT LEDs is illuminated, then the process continues to step 70, where the user moves in the indicated direction approximately one-half the distance to the base unit to repeat the test. However, if the distance moved is short at step 72, the user may simple decide to replace that section of wire, by preparing it at step 74. If the length of loop wire is too long to replace at step 72, then the process repeats by going to step 60, driving the probe unit ground rode and repeating the foregoing test sequence.

Now, returning to step 66 in FIG. 5, if both LEDs are illuminated, that indicates that both test frequencies are being detected by the probe unit, so the test is inconclusive. This is probably due to the poor earth ground path between the base unit and the probe unit, so the process continues to step 78 where the user connects a direct wire ground conductor between the base unit and the probe unit, which assures a low resistance ground path between the two units. Once complete, the process continues to step 80 where the users presses and holds the "WIRED" actuator switch to conduct a wired ground test procedure. At step 82, either one of the LEFT or RIGHT LEDs will illuminate, indicating the direction of movement for the subsequent test probe connection, which the users follows at step 84. However, if the distance moved is short at step 86, the user may simple decide to replace that section of loop wire, by preparing it at step 74. If the length of loop wire is too long to replace at step 86, then the users connects the test probe tip to the loop wire at that location at step 88, and returns to step 80 to repeat the forgoing WIRED test sequence. In either case, once the loop wire is repaired at step 74, the repair process is complete at step 76.

Figure 6:
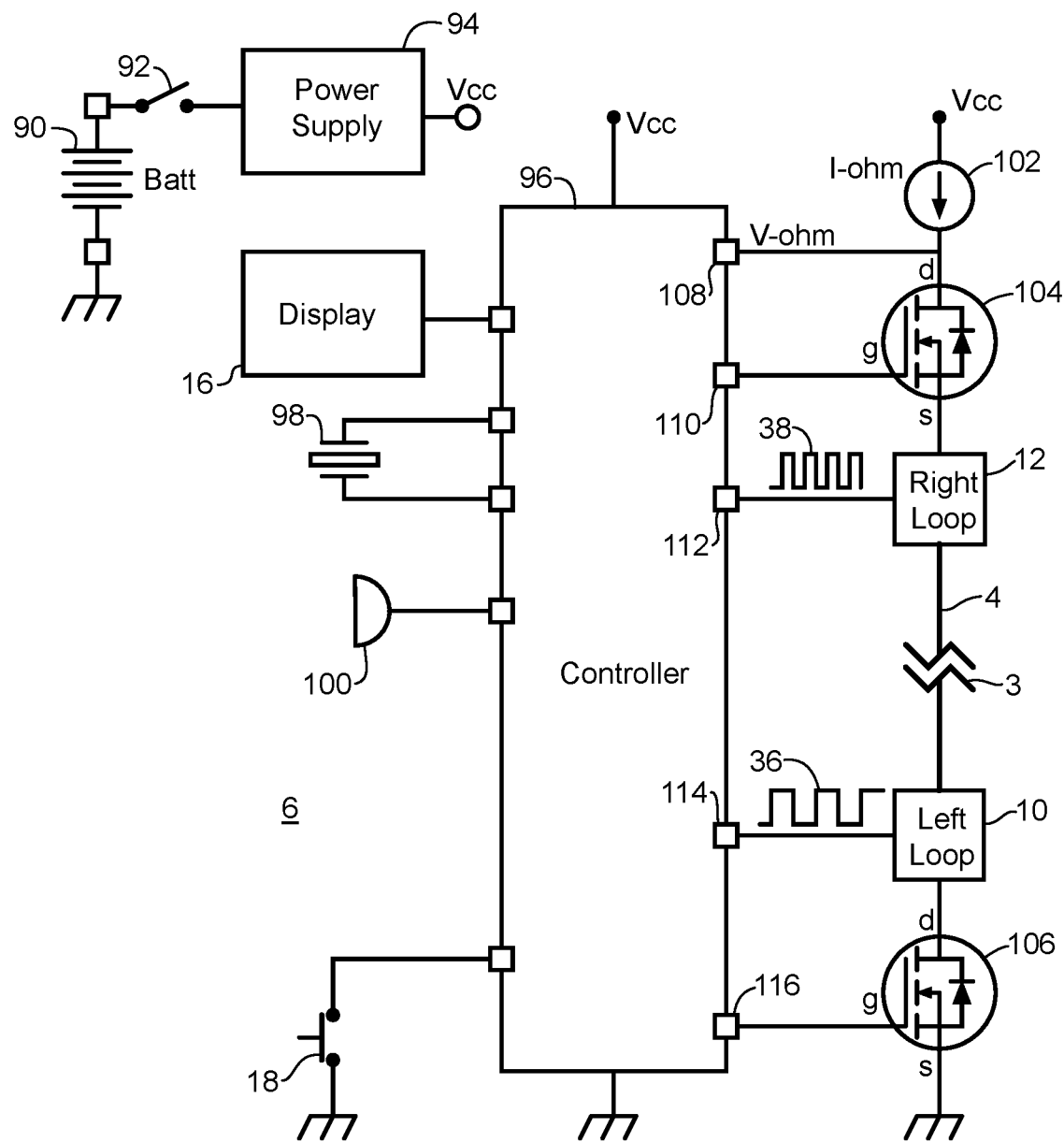
FIG. 6 is functional block diagram of a cable break detector base unit according to an illustrative embodiment of the present invention.

Reference is directed to FIG. 6, which is a functional block diagram of a cable break detector base unit 6 according to an illustrative embodiment of the present invention. The base unit 6 operates under control of a micro controller 96, as are known to those skilled in the art to incorporate digital logic level inputs and outputs, as well as analog to digital conversion circuits and interfaces to parallel and serial communications external devices, such as an alpha-numeric display 16. The controller 96 has a crystal 98 as a clock reference. In this illustrative embodiments, a battery 90 is coupled through an on/off switch 92 to a power supply circuit 94, which provides a Vcc power supply to the base unit 6, typically at five volts DC. An annunciator 100, which is a "buzzer" is also driven by the controller 96. A loop wire 4, which has a break 3 along its length, is connected to LEFT LOOP 10 and RIGHT LOOP 12 terminals. The LEFT LOOP terminal 10 is coupled to a signal port 114 in the controller 96, which is operable to transmit a first test frequency 36 into the loop wire 4 from the LEFT LOOP terminal 10. Similarly, the RIGHT LOOP terminal 12 is coupled to a signal port 112 in the controller 96, which is operable to transmit a second test frequency 38 into the loop wire 4 from the RIGHT LOOP terminal 12. The test frequency signals 36, 38 are square waves that have an amplitude equal to Vcc, and frequencies of 125 Hz and 250 Hz, respectively, in the illustrative embodiment. During test procedures, these two signals 36, 38 are driven alternatingly for short durations, for example 250 ms.

FIG. 6 illustrates another feature of the base unit 6 capabilities, and that is the measurement of the loop wire resistance using a micro-ohmmeter circuit. The micro-ohmmeter comprises a current source 102, which outputs a known current "I-ohm" from Vcc. The output voltage "V-ohm" of the current source 102 is coupled to an analog to digital converter input port 108 of the controller 96, such that the controller can measure that voltage. Having both I-ohm and V-ohm, the calculation of the resistance by the controller 96 is accomplished using Ohm's Law, yielding a micro-ohmmeter value reading. The current flow path of I-ohm is from Vcc, through MOSFET 104, the RIGHT LOOP terminal 12, the loop wire 4, the LEFT LOOP terminal 10, and MOSFET 106, which is coupled to ground. As such, the ability to measure loop resistance is controlled by switching the two MOSFETs 104, 106 between conductive and non-conductive states. It is noteworthy that the measurement of loop resistance is also multiplexed in time with the coupling of test signals 36, 38 into the loop wire 4. This is necessary because either of MOSFETs 104, 106 in the conductive states will load the respective terminals 10, 12 and prevent the test signals 36, 38 from flowing into the loop wire 4.

Figure 7:
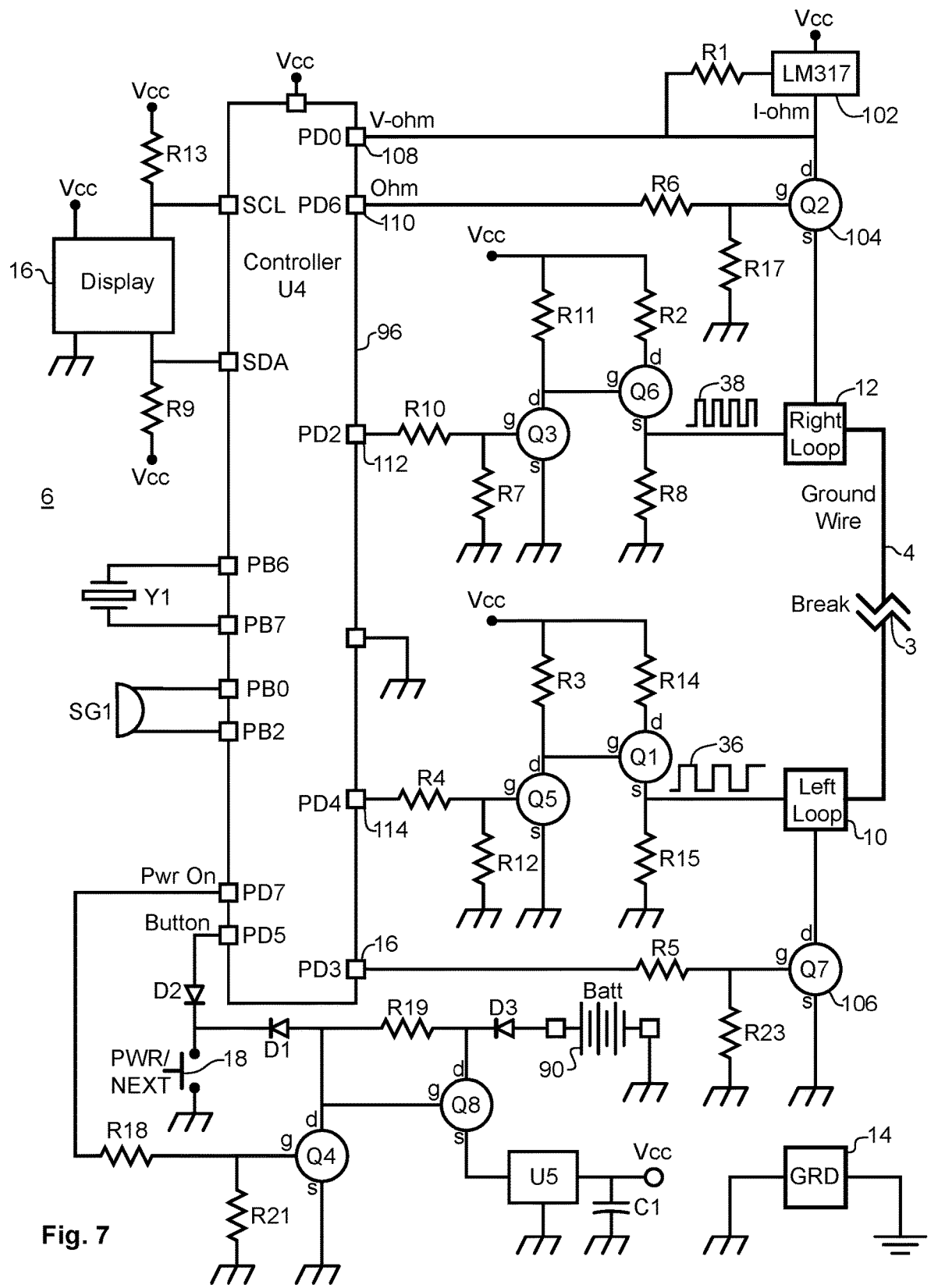
FIG. 7 is schematic diagram of a cable break detector base unit according to an illustrative embodiment of the present invention.

Reference is directed to FIG. 7, which is schematic diagram of a cable break detector base unit 6 according to an illustrative embodiment of the present invention. This schematic diagram presents a specific circuit design in an illustrative embodiment, which comprises the following component specifications, and which are identified in the drawing figure with the references in the following Table 1:

TABLE 1

| Component Reference | Description |
| --- | --- |
| R2, R14 | 10 Ω Resistor |
| R1 | 12 Ω Resistor |
| R4, R5, R6, R10, R18 | 56 Ω Resistor |
| R3, R7, R8, R9, R11, R12, R13, R15, R17, R19, R21, R23 | 15 kΩ Reistor |
| U4 | ATMEGA328PB-AU Microcontroller |
| U5 | LM317 Voltage Regulator (5 Vdc) |
| Q1, Q6, Q8 | NDP6020P - P-Channel MOSFET |
| Q2, Q7 | IRFZ44NPBG - N-Channel Power HEXFET |
| Q3, Q4 | 2N7000 - N-Channel MOSFET |
| Q5 | 2N7001 - N-Channel MOSFET |
| Y1 | 16 MHz Crystal |
| D1, D2, D3 | 1N4148 Diode |
| C1 | 100 uF Electrolytic Capacitor |
| SG1 | Piezo Buzzer |

In FIG. 7, the controller U4 is coupled to a sixteen character OLED alphanumeric display that is driven by serial interface, SCL, SDA in the controller U4, which serves to present operational parameters and instructions to a user. In the illustrate embodiment, the display 16 is an OLED 128×64 display, as are provided by multiple manufacturer, and are known to those skilled in the art. It is useful to incorporate a display the is sunlight readable. A momentary contact switch 18 "PWR/NXT" is input to the controller U4 and serves to turn on DC power to the base unit 6 and to sequence through operational steps. A six volt battery pack 90 provides power to the base unit, which is switch by Q4 and Q5 to drive voltage regulator U5 providing a five volt DC Vcc source to the entire circuit.

FIG. 7 illustrates a micro-ohmmeter circuit comprising an LM317 voltage regulator 102 configured as a current source outputting "I-ohm" amperes. "V-ohm" is the current source output voltage sensed using analog port PD0, labeled as 108, in the controller U4. In the illustrative embodiment, R1 is set to twelve ohms and Vcc is five volts, thius the current source 102 delivers approximately one hundred milliamps through the circuit. Power HEXFET Q2 is switched by port PD6, labeled as 110, of the controller U4, and is used to deliver "I-ohm" to the RIGHT LOOP terminal 12. Similarly, power HEXFET Q7 is switched by port PD3, labeled as 110, of the controller U4, and is used to couple "I-ohm" from the LEFT LOOP port 10 to ground, as illustrated. Power HEXFETS are employed because their higher voltage and current carrying capabilities accommodate real-world exposure to the environment more reliably than similar low paper devices. With this circuit, the loop wire 4 and break 3 resistance can be measure accurately. Note that GROUND terminal 14 provides coupling between the base unit 6 chassis ground and earth ground when a ground rod (not shown) is employed.

In FIG. 7, the first test frequency 36 is output from controller U4 port PD4, labeled as 114, and is drive into the LEFT LOOP terminal by MOSFETs Q5 and Q1. Similarly, the second test frequency 38 is output from controller U4 port PD2, labeled as 112, and is driven into the RIGHT LOOP terminal by MOSFETs Q3 and Q6.

Figure 8A:
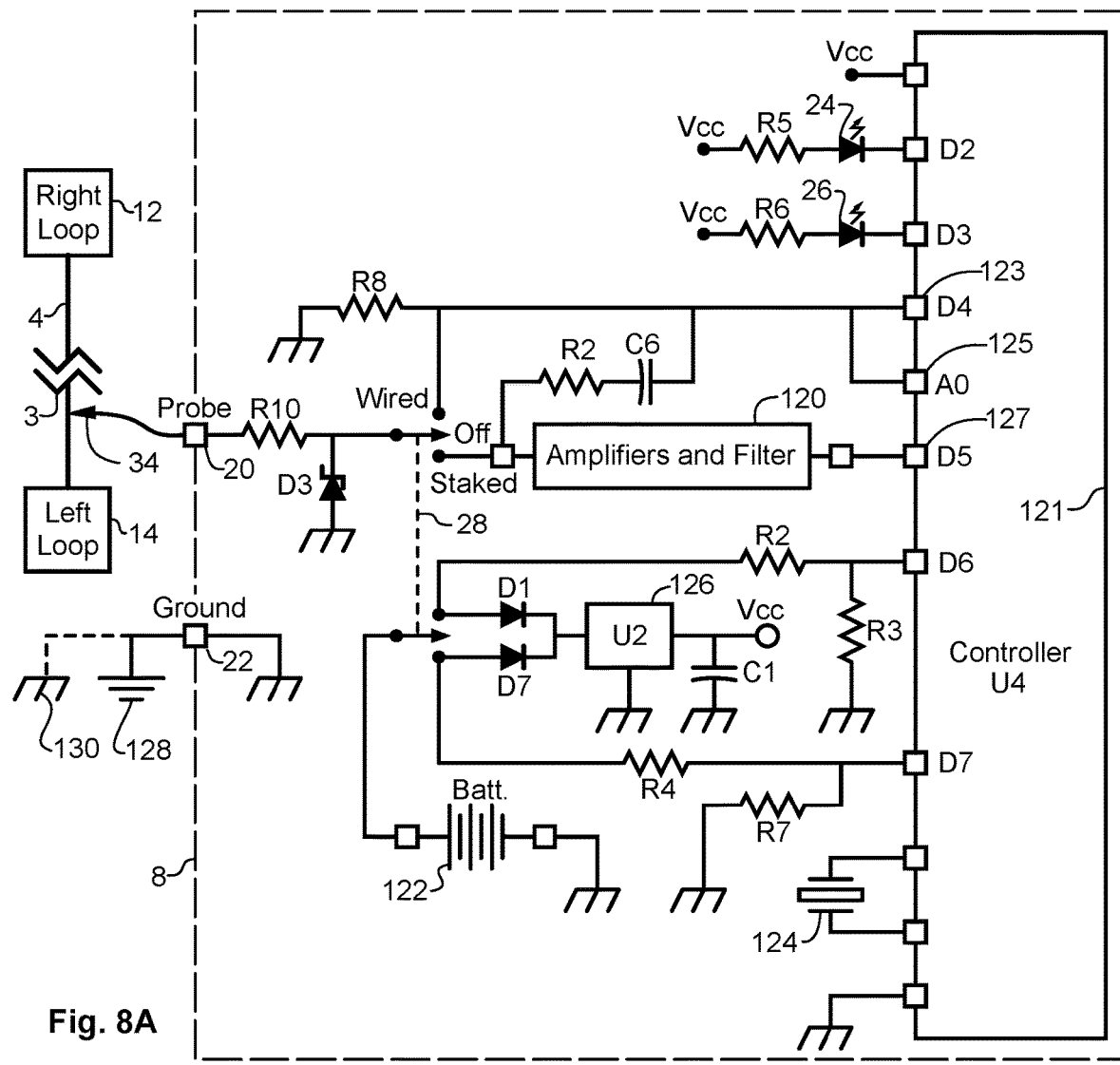
FIG. 8A is schematic diagram of a cable break detector probe unit according to an illustrative embodiment of the present invention.
Figure 8B:
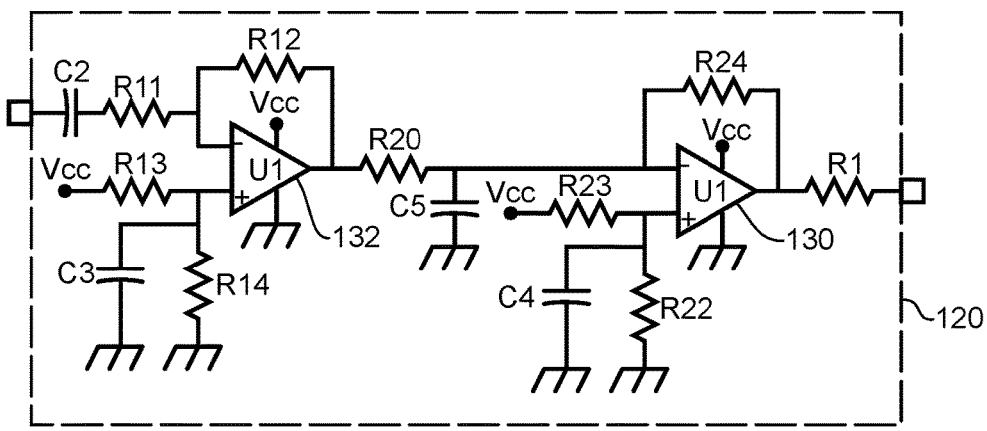
FIG. 8B is schematic diagram of an an amplifier and filter circuit in a cable break detector probe unit according to an illustrative embodiment of the present invention.

Reference is directed to FIGS. 8A and 8B, which are schematic diagrams of a cable break detector probe unit 8, and an amplifier and filter circuit 120, respectively, according to an illustrative embodiment of the present invention. These schematic diagrams present specific circuit designs in an illustrative embodiment, which comprises the following component specifications, and which are identified in the drawing figure with the references in the following Table 2:

TABLE 2

| Component Reference | Description |
| --- | --- |
| R4, R7, R13, R14, R22, R23 | 1 kΩ Resistor |
| R5, R6 | 220 Ω Resistor |
| R8 | 33 Ω Resistor |
| R10 | 10 Ω Resistor |
| R11 | 5.6 kΩ Resistor |
| R2, R12 | 1 MΩ Resistor |
| R1, R20 | 150 Ω Resistor |
| R24 | 470 kΩ Resistor |
| D2, D7 | 1N4148 Diode |
| D3 | 1N5993B Zener Diode (5.1 V) |
| C1 | 100 uF Electrolytic Capacitor |
| C2, C2, C3 | 4.7 uF Electrolytic Capacotor |
| C5 | 1 uF Capacitor |
| U1 | LM358AN Operational Amplifier |
| U2 | LM317 Voltage Regulator |
| U4 | ATMEGA328PB-AU Micro controller |

FIG. 8A also illustrates the loop wire 4, with break 3, that is connected to the LEFT LOOP terminal 12 and RIGHT LOOP terminal 14 of the base unit (not shown). The loop wire test probe 34 is attached to the loop wire 4 and also connected to the PROBE terminal 20 of the probe unit 8. The GROUND terminal 22 of the probe unit 8 may either be connected to an earth ground rod 128 or to the base unit chassis 130 via a solid ground conductor, as described hereinbefore.

The probe unit 8 in FIG. 8A employees the same micro controller U4 as the base unit, primarily for development and parts inventory commonality. The controller U4 provides digital inputs and outputs for logic level control, as well as analog to digital convertor inputs for voltage measurement purposes. A crystal 124 provides a clock reference. LEFT and RIGHT LEDs 24, 25 for driven by the controller U4 to provide output to the user. Power is supplied by a six volt battery pack 122, which is switch into circuit by the rocker switch 28, having a center-off position as well as both STAKED and WIRED positions selectable by the user. In either of these positions, power is coupled to voltage regulator U2 to produce Vcc at five volts DC. Inputs D6 and D7 of controller U4 inform as to which switch position the user has selected.

The STAKED/WIRED switch 28 also switches the PROBE terminal 20 through different circuits prior to input to the controller U4, 121. R10, a ten ohm resistor and D3, a zener diode, clamp the probe signal to approximately five volts before being switched. In the WIRED mode, the probe is loaded with R8, a thirty-three ohm resistor, and is then coupled to both a digital input D4, labeled as 123, and an ADC input A0, labeled as 125, to the controller 121. The signal is also coupled to an amplifier and filter circuit 120 through C6 and R2. This is useful so that when the LEFT and RIGHT LEDs 24, 26, are illuminated, in accordance with the greater signal detection amplitude on A0, 125, after the signal has been loaded with R8 (thirty ohms) the signal may drop below a logical one signal level at input D4, 123, and the detection may no longer function reliably. The signal coupled through R2 and C6 enables the system to reliably detect partial breaks with higher resistance values. In this manner, the controller is enabled to read the PROBE signal in plural level formats. If the wired ground connection to the base unit is low resistance (as it should be), and if the PROBE 34 is connected without the break 3 in line, then the PROBE signal can be sensed with logic level input D4. If not, then either analog input A0 can read the actual voltage level to compare levels between the first and second test frequencies, or that level can be amplified to above logic levels and read by a digital input (D5). The amplifier and filter 120 will be more fully discussed hereinafter.

When the STAKED/WIRED switch 28 is set to the STAKED position, then it is anticipated that the ground path has some added resistance. This results in a signal level that is lower than digital logic levels, so amplifier and filter circuit 120 is employed to raise the levels above logic level, which can be sensed by digital input D5. In any of these scenarios, the signal input to the controller U4 is a sampling of the first or second test frequencies present on the loop wire 4, and the controller U4 is programed to determine each signal's frequency and presence at the input, and also to compare signal levels at input A0 when that is the determining factor as to which signal is greater in amplitude, thereby establishing the location of the break 3 in the loop wire 4.

Note further that when the STAKED/WIRED switch 28 is set to STAKED, the signal from the probe 34 is heavily amplified and applied to the probe unit controller U4 for sampling. Each of the two test frequencies is detected in real time and the associated LEFT LED and & RIGHT LED are illuminated to indicate this detection. Since the majority of loop wire 4 breaks 3 are complete in nature, such that the resistance across the break 3 is in mega-ohms range, the STAKED mode can be used quickly to find those breaks without the extra time needed to run an independent ground wire between the base unit and the probe unit. If the Base unit displays "BREAK" and the STAKED mode shows both directions are are being receved, a partial break is suspected and the WIRED mode should be employed. When STAKED/WIRED switch 28 is set to WIRED, the direct signal from the probe 34 is applied across a small resistance, R8, to ground prior to being sampled by the controller U4. By reading the analog level of the two differing frequency signals coming from the base unit, when subjected to this load, the controller can show which signal is likely poor using the LEFT 24 and RIGHT 26 LEDs.

The amplifier and filter circuit 120 in FIG. 8A is detailed in FIG. 8B. U1 is an operational amplifier in two stages with a total gain of approximately 110dB. The gain level is selected to ensure that the amplified PROBE signal reaches digital logic levels. The filter, comprising R20 and C5 is a first order low-pass filter with half-power point at about 1 kHz, to reduce higher frequency noise. The topology of the filters will be recognized by those skilled in the art.

Figure 9:
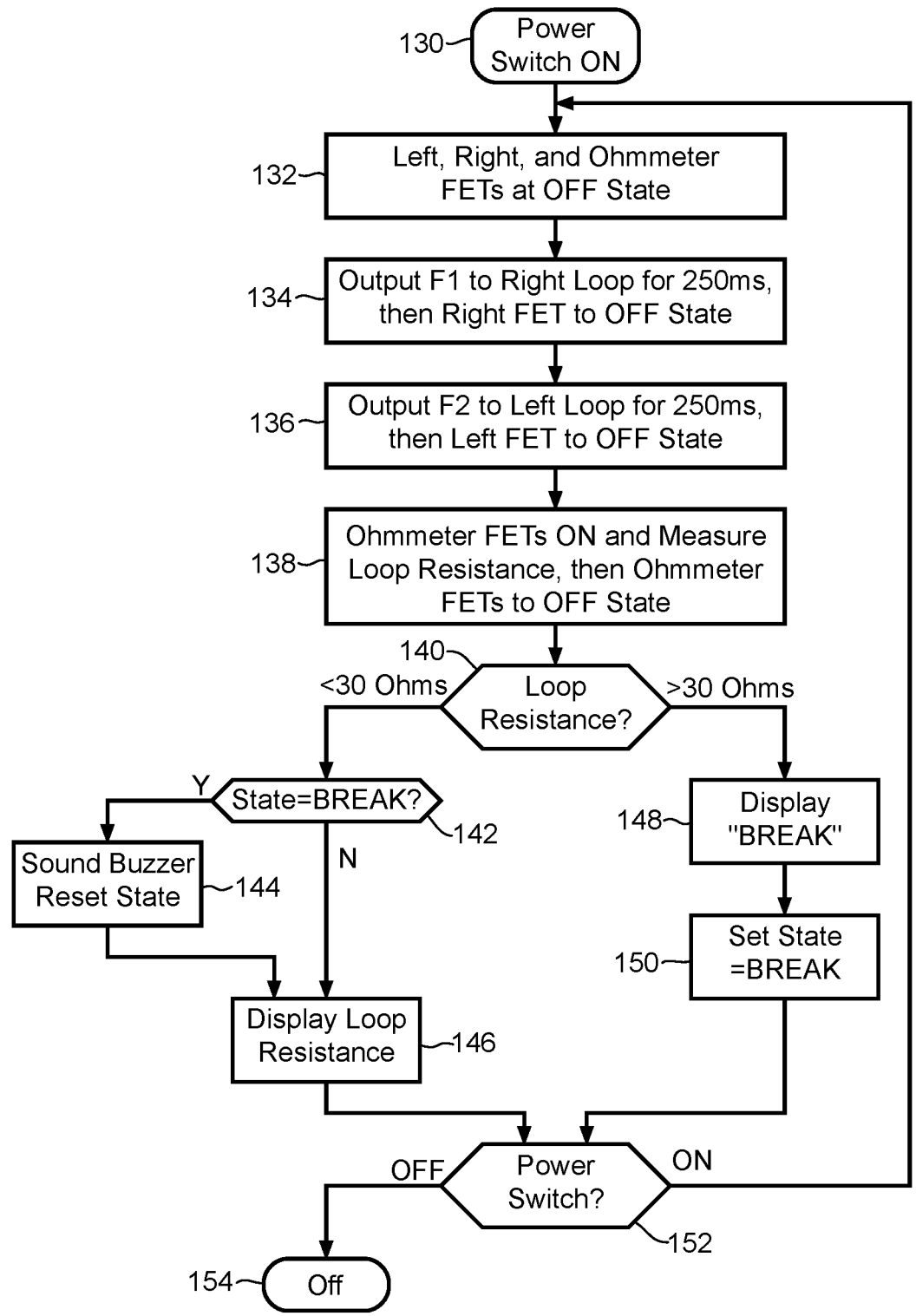
FIG. 9 is a process flow diagram of a cable break detector base unit operation according to an illustrative embodiment of the present invention.

Reference is directed to FIG. 9, which is a process flow diagram of a cable break detector base unit operation according to an illustrative embodiment of the present invention. The process begins at step 130 when the power is switched on. At step 132, the LEFT LOOP terminal, RIGHT LOOP terminal, and micro-ohmmeter coupling FETs are set to the high impedance state to unload all circuits. At step 134, the first test frequency ("F1") is coupled to the RIGHT LOOP terminal for 250 ms and then switched off. The duration is not critical, and is selected of reliable operation without sluggish behavior of the user experience. At step 136, the second test frequency ("F2") is coupled to the LEFT LOOP terminal for 250 ms and then switched off. This is followed by step 138 where both of the micro-ohmmeter FETs are turned on, and the loop wire resistance is measured. As will be described below, this sequence of F1, F2, resistance measurement is repeated as long as the power remains on in the base unit.

At step 140 in FIG. 9, the controller tests for the loop resistance, and if that resistance is less than a predetermined threshold, thirty ohms in this embodiment, then flow continues to step 142 where a test of a "BREAK" variable is conducted. For now, assuming the state is NO (variable set to false), then flow continues to step 146 where the controller writes the actual loop resistance to the base unit display, which is a value lower than the thirty ohm threshold, indicating that there is no break in the loop wire, and also informs the user as to what the "good" resistance value of the loop wire is. At step 152, if the power remains on, flow recirculates to step 132 to repeat. Going back to step 142, if the BREAK variable is set to YES (variable set to true), then the loop resistance has changed from above the resistance threshold to below the resistance threshold, indicating that the break in the loop wire has been successfully repaired, and an annunciator in the base unit is sounded to alert the user, and the state of the variable is reset to false.

Again referring to step 140 in FIG. 9, if the loop resistance is greater than the threshold level, then this indicates there is a break on the loop wire, so process flow continues to step 148. At step 148, the word "BREAK" is displayed on the base unit to advise the user that the loop wire has a break, reducing its expected conductivity, and that corrective action is required. In alternative embodiment, the actual resistance value may be displayed. However, considering the user interface process of FIG. 5, it can be appreciated that simply informing the user that a break exists is sufficient, and provides a more informed user experience. At step 150, the BREAK variable is set to true, and the process continues to step 152, the test for power. If power remains on, flow recirculates to step 132 to repeat, and if power is off, the process ends at step 154. Thus it can be appreciated that as long as the base unit power is on, the first and second test frequencies are repeatedly transmitted into the two ends of the loop wire, and the loop wire resistance is repeatedly tested, and if the loop wire is repaired during that time, an enunciator is sounded to advise the user that the repair has been accomplished.

Figure 10:
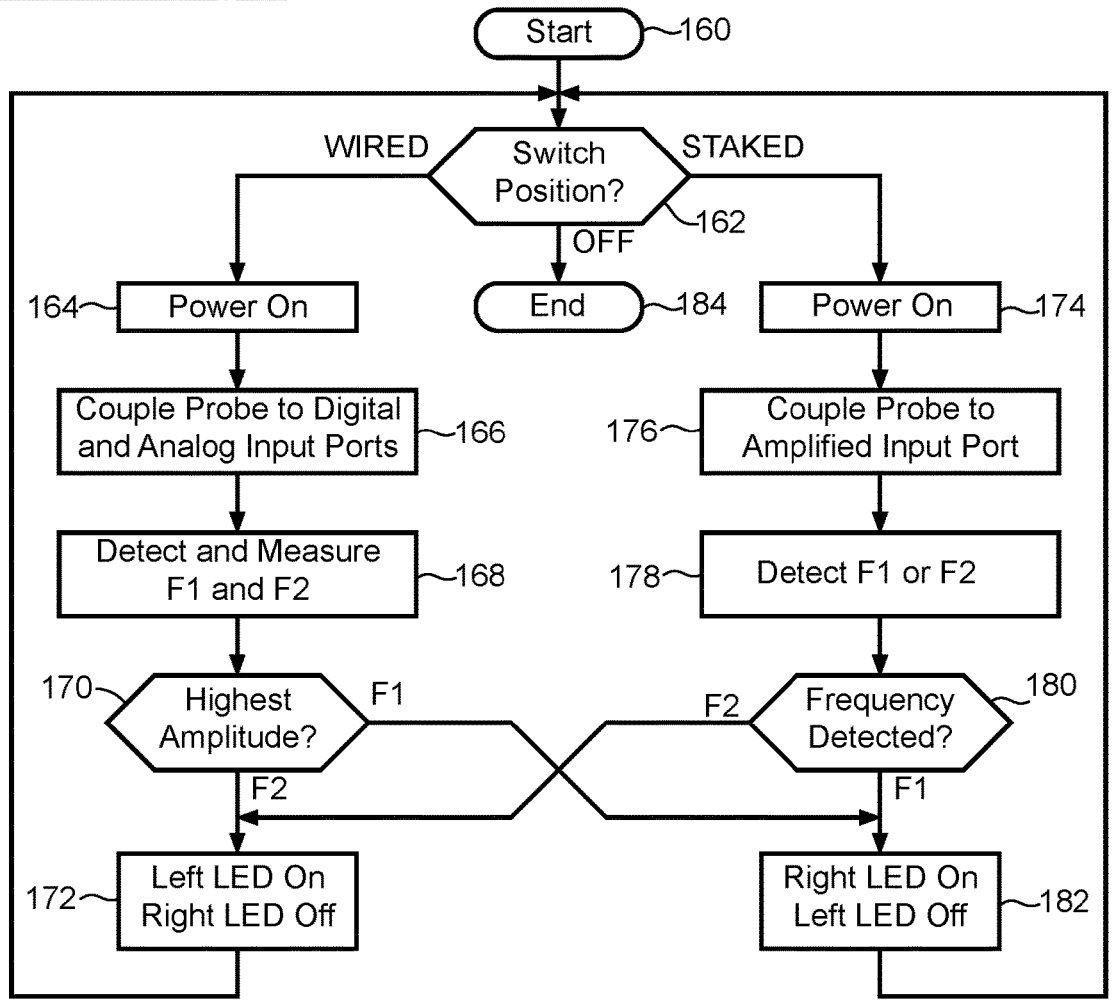
FIG. 10 is a process flow diagram of a cable break detector probe unit operation according to an illustrative embodiment of the present invention.

Reference is directed to FIG. 10, which is a process flow diagram of a cable break detector probe unit operation according to an illustrative embodiment of the present invention. With the base unit connected to the loop wire, and turned on to transmit the two test frequencies, F1 and F2, into the two ends of the loop wire, the user operates the probe unit to locate the break in the loop wire, and the probe unit operates in accordance with the process of FIG. 10. The process begins at step 160 and proceeds to step 162, where one of the two power-on switch positions, WIRED or STAKED, is selected. Of course, if neither is selected, the process ends at step 184. If WIRED is selected at step 162, then the power to the probe unit comes on at step 164, and the PROBE terminal of the probe unit is coupled to both digital and analog input ports on the probe unit controller, for sampling of the test signals. At step 168, the test frequencies are detected by the digital input and measured for relative amplitude by the analog input. At step 170, the relative amplitudes are compared. If the F2 test signal has the highest amplitude, then the LEFT LED is illuminated, indicating to the user to move in the opposite direction along the loop wire to isolate the break location, and the flow returns to step 162, to repeated the break location narrowing process. In the other hand at step 170, of the F1 test signal has the higher amplitude, then flow continues to step 182, where the RIGHT LED is illuminated, indicating to the user to move in the opposite direction along the loop wire to isolate the break location, and the flow returns to step 162, to repeated the break location narrowing process.

In FIG. 10, if the STAKED switch position is applied at step 162, the flow continues to step 174 where the probe unit is powered on, and PROBE terminal is coupled to the amplifier input port of the controller. By amplifying the signal, it is assured that the peak level in the test single square waves will be greater than the logic level 'ON' threshold of the controller. At step 178, the controller tests from the presence of the F1 or F2 signals. If F1 is detected at step 180, then the RIGHT LED is illuminated at step 182, indicating to the user to move in the opposite direction along the loop wire to isolate the break location, and the flow returns to step 162, to repeated the break location narrowing process. On the other hand, at step 180, if F2 is detected, then the LEFT LED is illuminated at step 172, indicating to the user to move in the opposite direction along the loop wire to isolate the break location, and the flow returns to step 162, to repeated the break location narrowing process. This testing and moving process continues until the break is repaired and the annunciator in the base unit sounds.

In FIG. 10, note that the left LED and right LED are illuminated to indicate the direction to and or from the break in the loop wire based on detection and measurement of the two test tone frequencies. Whether and LED is turned on or off to indicted the presence of a test tone, or whether an LED is turned on or off to indicate the direction of movement, is an arbitrary design choice. At its essence, the LED status are indicators to the user as to what the test status is, and in which direction to move about the loop wire to pursue the distance-halving operations aimed at isolating the loop wire break. The indication is arbitrarily defined, and it is only significant that the user be informed as to what the indication means. For example, an LED in the on state could mean that the test frequency from that direction was detected, or, it could mean that that is the direction in which to move. In another embodiment, dual color LEDs could be employed, for example, green mean good signal and red means no signal, or to move in the red direction, etc. The indication could also be presented on an alphanumeric display, or perhaps even indicated with different audible tones, and so forth. The key design goal is to inform the user as to which direction they should move in the distance-halving operation, as well as an indication when the break has been successfully repaired.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. A system for locating breaks in a loop wire which is buried in the soil, and that has first and second ends, comprising:

a base unit, having a signal generator coupled to a first terminal and a second terminal, for connection to the first and second ends of the loop wire respectively, and having a first ground terminal, said signal generator enabled to sequentially couple a first frequency signal to said first terminal and a second frequency signal to said second terminal;

a probe unit, having a signal detector responsive to said first frequency signal and said second signal frequency that is coupled to a probe terminal, and having a second ground terminal, and having a first direction indicator and a second direction indicator corresponding to directions along the loop wire to said first terminal and said second terminal, respectively;

an electrical ground connection between said first ground terminal and said second ground terminal;

a test probe connectable between said probe terminal and a location along the loop wire, and wherein said probe unit, upon detection of said first frequency signal, activates said second direction indicator to indicate there is a break in the loop wire in the direction of said second terminal, and upon detecting said second frequency signal, activates said first direction indicator to indicate there is a break in the loop wire in the direction of said first terminal.

2. The system of claim 1, and wherein said electrical ground connection comprises:

a first earth ground rod connected to said first ground terminal, and a second earth ground rod connected to said second ground terminal, which thereby establishes an earth ground path between said base unit and said probe unit.

3. The system of claim 2, wherein upon detection of both said first frequency signal and said second frequency signal by said signal detector, which correspondingly activates both of said first direction indictor and said second direction indicator, said system further comprises:

replacement of said first and second earth ground rods with a wire ground conductor connected between said first ground terminal and said second ground terminal.

4. The system of claim 3, and wherein said probe unit further comprises:

an amplifier and a mode selector switch selectable between a STAKED mode and a WIRED mode, and wherein while said earth ground path is connected, actuation of said mode selector switch to said STAKED mode connects said probe terminal directly to said signal detector, and while said wire ground conductor is connected, actuation of said mode selector switch to said WIRED mode connects said probe terminal through said amplifier and to said signal detector.

5. The system of claim 4, and wherein:
while said WIRED mode is selected, said signal detector compares amplitudes of said first frequency signal and said second frequency signal, and is responsive to activate either of said first direction indicator or said second direction indicator that corresponds with the lower amplitude signal.

6. The system of claim 1, and wherein:
said base unit further comprises an indicator and a micro-ohmmeter coupled to measure a resistance value between said first terminal and said second terminal, and wherein
said base unit operates to compare said resistance value with a resistance threshold value, and wherein
said base unit operates said indicator to indicate that there is no break in the loop wire if said resistance value is less than said resistance threshold value, and wherein
said base unit operates said indicator to indicate that there is a break in the loop wire if said resistance value is greater than said threshold resistance value.

7. The system of claim 6, and wherein:
said indicator is a display enabled to display said resistance value.

8. The system of claim 1, and wherein:
said first frequency signal and said second frequency signal are square wave signals at different frequencies within the audible frequency range.

9. The system of claim 1, and wherein:
said signals detector distinguishes said first frequency signal from said second frequency signal by measuring frequency thereof.

10. The system of claim 1, and wherein:
said signal generator repetitively and sequentially couples said first test frequency for a first time period followed by said second test frequency for a second time period.

11. A method of locating breaks in a loop wire that is buried in the soil, using a base unit having a signal generator, and a probe unit having a signal detector, comprising the steps of:
connecting the base unit to a first end and a second end of the loop wire;
connecting an electrical ground between the base unit and the probe unit thereby establishing a ground reference therebetween;
sequentially coupling a first frequency signal into the first end of the loop wire, and coupling a second frequency signal into the second end for the loop wire;
connecting a test probe between the probe unit and a first location along the loop wire;
detecting either of the first test signal or the second test signal by the signal detector, and
upon detecting the first frequency signal, indicating there is a break in the loop wire in the direction of the second end, and
upon detecting the second frequency signal, indicating there is a break in the loop wire in the direction of the first end, and
relocating the test probe to a second location along the loop wire in the indicated direction of the break in the loop wire and repeating said detecting step.

12. The method of claim 11, and wherein:
said connecting an electrical ground step further comprises the steps of:
connecting a first earth ground rod to the base unit, and connecting a second earth ground rod to the probe unit, thereby establishing an earth ground path as the ground reference.

13. The method of claim 12, and further comprising the steps of:
upon detecting both of the first frequency and the second frequency at said detecting step;
replacing the earth ground path with a wire ground conductor, and
repeating said detecting step.

14. The method of claim 13, wherein the probe unit includes and amplifier and a mode selector for either a STAKED mode or a WIRED mode, and further comprising the steps of:
while the earth ground path is connected, said detecting step is initiated using the mode selector to engage a STAKED mode that connects the test probe to the signal detector, and
while the wire ground conductor is connected, said detecting step is initiated using the mode selector to engage a WIRED mode that amplifies the test probe connection to the signal detector.

15. The method of claim 14, and wherein:
said detecting step in the WIRED mode is accomplished by comparing the amplitude of the first frequency signal with the amplitude of the second frequency signal, where the lower amplitude signal is indicative of the direction of the break in the loop wire.

16. The method of claim 11, and wherein the base unit includes a micro-ohmmeter, and further comprising the steps of:
measuring a resistance value between the first end and the second end of the loop wire;
comparing the resistance value with a resistance threshold value, and
upon determining that the resistance value is less than the resistance threshold value, indicating that there is no break in the loop wire, and terminating said detection step, or
upon determining that the resistance value is greater than the threshold value, indicating that there is a break in the loop wire, and continuing said determining step.

17. The method of claim 16, and further comprising the steps of:
displaying the resistance value by the base unit.

18. The method of claim 16, and further comprising the step of:
upon measuring a resistance value this is greater then the resistance threshold value, setting a BREAK variable, and
upon measuring a subsequent resistance value that is less then the resistance threshold value while set BREAK variable is set, indicating that the loop wire break has been eliminated.

19. The method of claim 11, and wherein the first frequency signal and second frequency signal are square wave signals at different frequencies within the audible frequency range.

20. The method of claim 11, and wherein:
said detecting step is accomplished by identifying the frequency of either the first test frequency or the second test frequency.

21. The method of claim 11, and wherein:
said sequentially coupling step includes repetitively coupling the first test frequency for a first time period followed by coupling the second test frequency for a second time period, wherein the time periods are the same duration.

\* \* \* \* \*